United States Patent [19]
Symons

[11] Patent Number: 5,391,998
[45] Date of Patent: Feb. 21, 1995

[54] MODULATOR FOR EFFICIENTLY GENERATING SHORT HIGH VOLTAGE REPETITIVE PULSES

[75] Inventor: Robert S. Symons, Los Altos, Calif.

[73] Assignee: Litton Systems, Inc., Beverly Hills, Calif.

[21] Appl. No.: 100,491

[22] Filed: Jul. 30, 1993

[51] Int. Cl.[6] .............................................. H03K 3/37
[52] U.S. Cl. ..................... 327/181; 327/183; 327/304; 327/305
[58] Field of Search ..................... 328/65, 67, 84; 307/260, 265

[56] References Cited
U.S. PATENT DOCUMENTS

| | | | |
|---|---|---|---|
| 4,042,837 | 8/1977 | Nyswander | 328/65 |
| 4,090,140 | 5/1978 | Carter | 328/65 |
| 4,160,214 | 7/1979 | Colin et al. | 328/65 |
| 4,684,820 | 8/1987 | Valencia | 328/65 |

Primary Examiner—Timothy P. Callahan
Assistant Examiner—Dinh Le
Attorney, Agent, or Firm—Graham & James

[57] ABSTRACT

A modulator for producing repetitive short high voltage pulses is provided. The modulator includes a high voltage power supply, a plurality of pulse forming networks each capable of being charged to a potential equal to twice the voltage of the high voltage power supply, and a plurality of switches interconnecting the pulse forming networks. The switches have a first state connecting the pulse forming networks in parallel with the high voltage power supply to charge the pulse forming networks, and a second state connecting the pulse forming networks in series to discharge the pulse forming networks into a load. The pulse forming networks are charged by use of a resonant charging technique. The modulator further includes an input configured to receive a triggering pulse, the triggering pulse causing the switches to change from the first state to the second state.

25 Claims, 1 Drawing Sheet

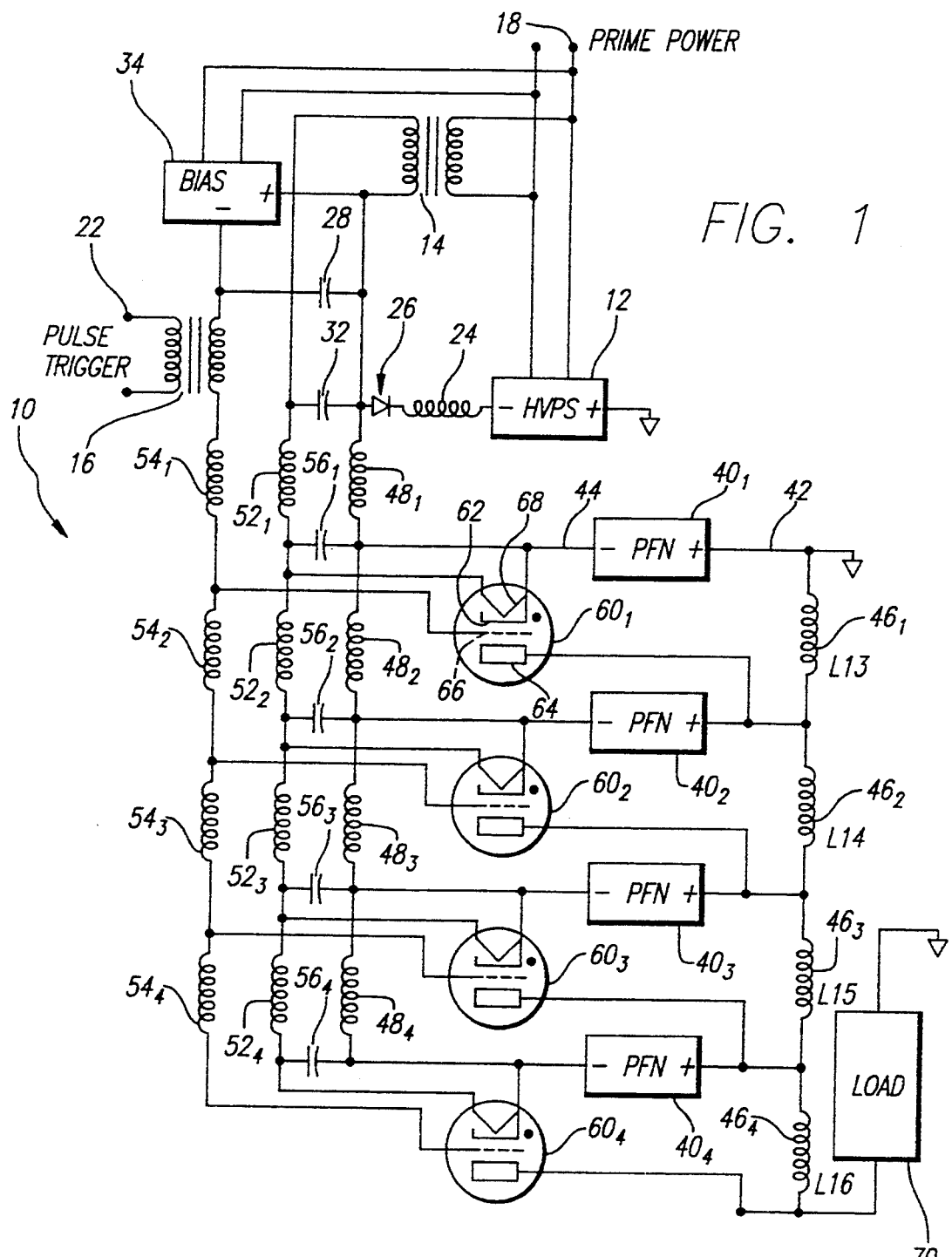

MODULATOR FOR EFFICIENTLY GENERATING SHORT HIGH VOLTAGE REPETITIVE PULSES

BACKGROUND OF THE INVENTION

1. Field of the Invention

The present invention relates to the generation of short rectangular high voltage pulses of electrical energy, and more particularly, to a novel modulator having a number of pulse forming networks connected so that they may be charged in parallel and discharged in series to provide high voltage pulses with fast rise and fall times.

2. Description of Related Art

Many types of electrical apparatus, such as microwave tubes used in radar transmitters and particle accelerators, require short rectangular high voltage pulses of electrical energy for their operation. These pulses may be on the order of tens or hundreds of kilovolts with a pulse width in the nanosecond or microsecond range. The repetition frequency of the pulses may range from one hundred to several thousand Hertz.

The predominant technology for generating these pulses makes use of a pulse forming network which functions as an artificial transmission line. The network is charged to a desired voltage level and then is coupled to an external load by a switch. Since neither the network or the switch can withstand the high voltage level required by the load, a transformer raises the network voltage to the required level. The switch is activated by external timing signals. This discharges the network into the primary windings of the transformer which provides the stepped up voltage pulse to the load. After each pulse has been transmitted, the charging of the network is repeated.

The switch may be a solid state device, or a gas filled tube such as a thyratron. A thyratron is filled with hydrogen gas and is capable of withstanding about 50 to 100 kilovolts between its cathode and anode. The thyratron has a grid disposed between the cathode and anode, and thyratrons of higher voltage ratings may have a plurality of such grids. Ionization of the hydrogen gas is initiated by a triggering voltage applied to the grid nearest the cathode, which overcomes the negative bias of the grid with respect to the cathode and initiates an arc discharge of current from the cathode to the anode. Thyratrons are generally preferred over solid state devices, since they can withstand a much higher voltage in the "off" state and conduct higher current in the "on" state.

However, a drawback with the prior art pulse generators is that the transformer tends to degrade the quality of the pulse at high voltage levels and short pulse widths. When the transformer step-up ratio is high, the leakage inductance of the transformer is also high, which tends to increase the rise and fall times of short pulses. Thus, it is increasingly difficult to provide rectangular high voltage pulses having very fast rise and fall times.

Accordingly, it would be desirable to provide a modulator which overcomes these difficulties of the prior art. It would be further desirable to provide a modulator which does not use a transformer to increase the voltage level above that which the network can withstand.

SUMMARY OF THE INVENTION

In accordance with the teachings of this invention, a modulator for producing repetitive short high voltage pulses is provided. The modulator includes a high voltage power supply, a plurality of pulse forming networks each capable of being charged to a potential equal to twice the voltage of the high voltage power supply, and a plurality of switches interconnecting the pulse forming networks. The switches have two operational states. In the first state, the pulse forming networks are connected in parallel with the high voltage power supply to provide the charge to each of the pulse forming networks, and in the second state the pulse forming networks are connected in series to discharge the pulse forming networks into a load. The modulator further includes an input configured to receive a triggering pulse which causes the switches to change from the first state to the second state.

More particularly, the switches further comprise a plurality of thyratrons each having a cathode, an anode, and a grid disposed between the anode and the cathode. The grids are coupled to the input and receive the triggering pulse. The modulator further provides for the heating of the cathodes of the thyratrons, and for the deionizing of the thyratrons after the discharge of the pulse forming networks by maintaining a proper relationship between the network impedances and the load resistance. The pulse forming networks are charged to double the power supply voltage by use of a resonant charging technique. Inadvertent discharge of the pulse forming networks back into the high voltage power supply is prevented by the use of a charging diode.

The invention further provides a method for producing repetitive short high voltage pulses. The method comprises the steps of providing a high voltage power source, charging a plurality of pulse forming networks by coupling the pulse forming networks in parallel with the high voltage power source, and discharging the plurality of pulse forming networks by coupling the pulse forming networks in series with a load. The pulse forming networks are charged to a potential equal to twice the voltage of the high voltage power source. Half of the maximum voltage from each of the pulse forming networks is provided to the load. The charging and discharging steps are repeated at a predetermined repetition frequency.

A more complete understanding of the modulator for producing repetitive short high voltage pulses will be afforded to those skilled in the art, as well as a realization of additional advantages and objects thereof, by consideration of the following detailed description of the preferred embodiment. Reference will be made to the appended sheets of drawings which will be first described briefly.

BRIEF DESCRIPTION OF THE DRAWINGS

FIG. 1 is a schematic of a modulator of the present invention; and

FIG. 2 is a schematic of a pulse forming network of the modulator of FIG. 1.

DETAILED DESCRIPTION OF THE PREFERRED EMBODIMENT

The present invention provides a modulator for producing repetitive short high voltage pulses having relatively fast rise and fall times and which does not require a transformer to step up the pulse voltage.

Referring to FIGS. 1 and 2, a schematic drawing of a modulator circuit 10 is illustrated. The modulator 10 has a power input terminal 18 which receives an alternating current (AC) prime power input, and a triggering input terminal 22 which receives an input triggering pulse. As will be fully described below, the triggering pulse initiates a high voltage output pulse which is provided to a load 70.

The modulator 10 further includes a high voltage power supply 12, a trigger transformer 16, a cathode heater transformer 14, and a bias supply 34. The high voltage power supply 12 is a DC power supply which is connected to the input terminal 18, receives the AC prime power from terminal 18 and produces a charging voltage. The high voltage power supply 12 has a positive and a negative output terminal. The negative terminal is electrically connected to a charging inductor 24, which in turn is electrically connected to a diode 26. The positive terminal is electrically connected to ground. The cathode heater transformer 14 also receives the prime power from terminal 18, and produces cathode heater voltage. The trigger transformer 16 receives the trigger pulse from input terminal 22, and produces trigger voltage. The bias supply 34 maintains a negative voltage to prevent inadvertent triggering of the modulator, as will be further explained below.

The modulator 10 has a plurality of network/switch stages which are substantially identical. For purposes of explanation, only the first stage will be described, but it should be appreciated that the additional stages operate in substantially the same manner. Each stage comprises a pulse forming network 40, a thyratron 60, a first inductor 46, a second inductor 48, a third inductor 52, and a fourth inductor 54.

As illustrated in FIG. 2, the pulse forming networks 40 have capacitors 72 and inductors 74 connected in a "ladder" circuit to form an artificial transmission line with a time delay equal to one half the desired pulse length. Pulse forming networks are well known to those skilled in the art, and other such equivalent networks could be substituted as desired. The pulse forming networks 40 have a positive and a negative terminal, with the positive terminal coupled to ground. The first inductor $46_1$ is also electrically coupled to the positive terminal of the pulse forming network 40, and in series to each of the first inductors $46_2$, $46_3$, and $46_4$, which electrically connect each of the positive terminals of the pulse forming networks 40 together and to ground.

The thyratrons 60 have a cathode 62, an anode 64, a grid 66 and a cathode heater 68. The thyratrons are filled with a hydrogen gas which ionizes when a proper trigger signal is applied between the grid 66 and the anode 64, resulting in high current flow between the cathode 62 and the anode. The negative voltage applied by the bias supply 34 to the grid 66 acts as a gate for electrons and maintains the thyratrons in the off state until the trigger pulse is applied. The potential across the cathode heater 68 maintains the cathode surface at a temperature which permits thermionic emission of electrons from the cathode surface.

The cathodes 62 are electrically connected to the negative terminal of the pulse forming networks 40. The second inductor $48_1$ electrically connects the cathode 62 of thyratron $60_1$ and negative terminal of the pulse forming network $40_1$ to the high voltage power supply 12 through the diode 26, and is electrically coupled in series to each of the second inductors $48_2$, $48_3$, and $48_4$, which electrically connect to each of the cathodes 62 and pulse forming networks 40 of the stages. The third inductor $52_1$ electrically connects the cathode heater 68 of the thyratron $60_1$ to the heater transformer 14, and is electrically coupled in series to each of the third inductors $52_2$, $52_3$, and $52_4$, which electrically connect to each of the cathode heaters 68. The fourth inductor $54_1$ electrically connects the triggering transformer 16 with the grid 66 of the thyratron $60_1$, and is electrically coupled in series to each of the fourth inductors $54_2$, $54_3$, and $54_4$, which electrically connects to each of the grids 66. The inductors 48, 52 and 54 are wound in trifilar configuration so that the same voltage will exist across the inductors due to the large mutual inductance and capacitance between the windings.

In operation, the inductors 48 and 46 connect the pulse forming networks 40 in parallel with the high voltage power supply 12 at low frequencies comparable to the repetition frequency of the modulator, charging the pulse forming networks by resonant charging to a voltage level equal to twice the voltage of the high voltage power supply 12. The charging inductor 24 has a much larger inductance than that of any of the other inductors in the circuit, such that it is resonant at slightly more than half the maximum repetition frequency when combined with the capacitances of all the pulse forming networks 40 in parallel. When prime power is furnished to the high voltage power supply 12, current flows through the charging diode 26 and the charging inductor 24, charging all the pulse forming networks 40 to twice the power supply voltage in a sinusoidally varying waveform. The diode 26 prevents the discharge of the pulse forming networks 40 back into the high voltage power supply 12.

When a triggering voltage provided at input 22 overcomes the negative bias on the thyratrons 60 due to the bias supply 34, current flows from the cathodes 62 to the anodes 64 of all the thyratrons simultaneously, connecting all the pulse forming networks 40 in series. Because each pulse forming network 40 delivers a voltage nearly equal to one-half the voltage to which it is charged, the four networks illustrated in FIG. 1 will produce a pulse very nearly equal to four times the power supply voltage if the load impedance is slightly less than four times the pulse forming network impedance. In an embodiment of the present invention, the impedance of the pulse forming networks 40 is slightly higher than its share of the load impedance so the voltage on the pulse forming network will reverse slightly after the pulse and deionize the thyratrons 60. The diode 78 and resistor 76 in FIG. 2 will dissipate this reverse voltage and prepare the network for the next charging cycle.

With a high voltage power supply 12 having a voltage output of 10 kilovolts, the voltage of the pulse provided to the load 70 would be four times the power supply voltage, or 40 kilovolts. It should be apparent to those skilled in the art that higher voltage pulse values can be obtained by adding additional stages beyond the four stages illustrated in FIG. 1. It should also be apparent that the components of the modulator 10 may be configured to provide positive going voltage pulses as well as the negative going pulses described above.

Having thus described a preferred embodiment of a modulator for producing repetitive short high voltage pulses, it should now be apparent to those in the art that the aforestated objects and advantages for the within system have been achieved. It should also be appreciated by those skilled in the art that various modifica- tions, adaptations, and alternative embodiments thereof may be made within the scope and spirit of the present invention, which is further defined by the following claims.

What is claimed is:

1. A modulator for producing repetitive short high voltage pulses, comprising:
   a high voltage power supply;
   a plurality of pulse forming networks;
   means for resonant charging said pulse forming networks by connecting said pulse forming networks in parallel with said high voltage power supply; and
   means for discharging said pulse forming networks in series into a load.

2. The modulator of claim 1, wherein said pulse forming networks further comprise first and second terminals, and are capable of being charged to a potential equal to twice the voltage of said high voltage power supply.

3. The modulator of claim 2, wherein said charging means comprises:
   a charging inductor coupled to said high voltage power supply having an inductance greater than an inductance of said pulse forming networks;
   a plurality of first inductors coupled together in series between said load and ground, associated ones of said first inductors being further coupled to said first terminals of said pulse forming networks;
   a plurality of second inductors coupled together in series and to said charging inductor, associated ones of said second inductors being further coupled to said second terminals of said pulse forming networks together; and
   a plurality of thyratrons, each having a cathode, an anode and a grid disposed between said anode and said cathode, said cathodes being coupled to associated ones of said second terminals of said pulse forming networks, said anodes being coupled to associated ones of said first inductors;
   wherein, said pulse forming networks are charged in parallel by said high voltage power supply through said charging inductor and said first and second inductors due to non-conductance between said cathodes and said anodes.

4. The modulator of claim 3, wherein said discharging means comprises:
   an input transformer receiving a triggering pulse; and
   a plurality of third inductors coupled in series to said input transformer, associated ones of said third inductors being further coupled to said grids of said thyratrons;
   whereby said triggering pulse causes each of said thyratrons to conduct between said cathodes and said anodes connecting said pulse forming networks in series.

5. The modulator of claim 4, wherein said first, second, and third inductors are wound in trifilar configuration.

6. The modulator of claim 3, further comprising means for heating said cathodes of said thyratrons.

7. The modulator of claim 1, further comprising means for preventing said pulse forming networks from discharging into said high voltage power supply.

8. A modulator for producing repetitive short high voltage pulses, comprising:
   a high voltage power supply;
   a plurality of pulse forming networks each capable of being charged to a potential equal to twice the voltage of said high voltage power supply; and
   a plurality of switches, each of said switches interconnecting respective ones of said pulse forming networks, said switches each having a first state connecting said pulse forming networks in parallel with said high voltage power supply to charge said pulse forming networks, and a second state connecting said pulse forming networks in series to discharge said pulse forming networks into a load.

9. The modulator of claim 8, further comprising an input transformer receiving a triggering pulse, said triggering pulse causing said switches to change from said first state to said second state.

10. The modulator of claim 8, further comprising means for resonant charging said pulse forming networks.

11. The modulator of claim 8, further comprising means for preventing said pulse forming networks from discharging into said high voltage power supply.

12. The modulator of claim 9, wherein each of said switches comprises a thyratron.

13. The modulator of claim 12, wherein said thyratrons further comprise a cathode, an anode and a grid disposed between said anode and said cathode, said grids coupled to receive said triggering pulse.

14. The modulator of claim 13, further comprising means for heating said cathodes of said thyratrons.

15. The modulator of claim 12, further comprising means for deionizing said thyratrons after discharge of said pulse forming networks.

16. A modulator for producing high voltage pulses, comprising:
   a high voltage power supply;
   a plurality of pulse forming networks each capable of being charged to a potential equal to twice the voltage of said high voltage power supply;
   a plurality of switches., each of said switches interconnecting respective ones of said pulse forming networks, said switches each having a first state connecting said pulse forming networks in parallel with said high voltage power supply to charge said pulse forming networks, and a second state connecting said pulse forming networks in series to discharge said pulse forming networks into a load; and
   an input configured to receive a triggering pulse, said triggering pulse causing said switches to change from said first state to said second state.

17. The modulator of claim 16, wherein said switches further comprise a plurality of thyratrons each having a cathode, an anode and a grid disposed between said anodes and said cathodes, said grids coupled to said input and receiving said triggering pulse.

18. The modulator of claim 17, further comprising means for heating said cathodes of said thyratrons.

19. The modulator of claim 16, further comprising means for preventing said pulse forming networks from discharging into said high voltage power supply.

20. The modulator of claim 16, further comprising means for resonant charging said pulse forming networks.

21. The modulator of claim 17, further comprising means for deionizing said thyratrons after discharge of said pulse forming networks.

22. A method for producing repetitive short high voltage pulses, comprising the steps of:

providing a high voltage power source;
charging a plurality of pulse forming networks by coupling said pulse forming networks in parallel with said high voltage power source, said pulse forming networks being charged to a potential equal to twice the voltage of said high voltage power source;
discharging said plurality of pulse forming networks by coupling said pulse forming networks in series with a load; and
repeating said charging and discharging steps at a predetermined repetition frequency.

23. The method of claim 22, further comprising the step of receiving a triggering pulse to initiate switching said pulse forming networks from said charging step to said discharging step.

24. The method of claim 22, wherein said charging step further comprises resonant charging said pulse forming networks.

25. The method of claim 22, further comprising the step of preventing said pulse forming networks from discharging into said high voltage power source during said discharging step.

* * * * *